(12) United States Patent
Lee et al.

(10) Patent No.: US 10,285,262 B2
(45) Date of Patent: May 7, 2019

(54) PATTERN SAFETY DEVICE FOR PREVENTING INTERFERENCE BETWEEN PATTERNS

(71) Applicant: G-SMATT CO., LTD., Pyeongtaek-si, Gyeonggi-do (KR)

(72) Inventors: Ho Joon Lee, Seoul (KR); Hak Ryul Shin, Busan (KR); Sang Eun Lee, Pyeongtaek-si (KR)

(73) Assignee: G-SMATT CO., LTD., Gyeonggi-Do (KR)

( * ) Notice: Subject to any disclaimer, the term of this patent is extended or adjusted under 35 U.S.C. 154(b) by 125 days.

(21) Appl. No.: 14/777,043

(22) PCT Filed: Mar. 12, 2014

(86) PCT No.: PCT/KR2014/002026
§ 371 (c)(1),
(2) Date: Sep. 15, 2015

(87) PCT Pub. No.: WO2014/142530
PCT Pub. Date: Sep. 18, 2014

(65) Prior Publication Data
US 2016/0050749 A1    Feb. 18, 2016

(30) Foreign Application Priority Data

Mar. 15, 2013 (KR) .......... 10-2013-0028173

(51) Int. Cl.
*H05K 1/02* (2006.01)
*H01L 25/075* (2006.01)
(Continued)

(52) U.S. Cl.
CPC ....... *H05K 1/0272* (2013.01); *H01L 25/0753* (2013.01); *H05K 1/111* (2013.01);
(Continued)

(58) Field of Classification Search
CPC .............................. H05K 1/0272; H05K 3/06
(Continued)

(56) References Cited

U.S. PATENT DOCUMENTS

2006/0191711 A1* 8/2006 Cho ................. H01L 23/5389
174/260
2009/0251040 A1* 10/2009 Kim ..................... G09G 3/2085
313/307
(Continued)

FOREIGN PATENT DOCUMENTS

JP    2008507001 A    3/2008
KR    100902862 B1    6/2009
(Continued)

OTHER PUBLICATIONS

International Search Report with English Translation for International Application No. PCT/KR2014/002026 dated Jul. 17, 2014.
(Continued)

*Primary Examiner* — Stanley Tso
(74) *Attorney, Agent, or Firm* — Cantor Colburn LLP

(57) ABSTRACT

Disclosed herein is a pattern safety device for preventing interference between patterns. In detail, a separately partitioned space is defined in an adhesion portion, which is formed on a plurality of patterns on the surface of a substrate so that a circuit element is placed on the adhesion portion, thus preventing interference between the patterns.

4 Claims, 6 Drawing Sheets

(51) Int. Cl.
  *H05K 1/11* (2006.01)
  *H05K 3/32* (2006.01)
  *H05K 3/06* (2006.01)
(52) U.S. Cl.
  CPC ...... *H05K 3/321* (2013.01); *H01L 2924/0002* (2013.01); *H05K 3/06* (2013.01); *H05K 2201/0761* (2013.01); *H05K 2201/09363* (2013.01); *Y02P 70/611* (2015.11)
(58) Field of Classification Search
  USPC .......................................................... 174/260
  See application file for complete search history.

(56) References Cited

U.S. PATENT DOCUMENTS

| | | | |
|---|---|---|---|
| 2010/0263246 A1* | 10/2010 | Oh | H05K 3/02 40/541 |
| 2014/0124347 A1* | 5/2014 | Jiang | G06F 3/041 200/5 A |

FOREIGN PATENT DOCUMENTS

| | | |
|---|---|---|
| WO | 2007055456 A1 | 5/2007 |
| WO | 2014014170 A1 | 1/2014 |

OTHER PUBLICATIONS

Written Opinion for International Application No. PCT/KR2014/002026 dated Jul. 17, 2014.

* cited by examiner

PATTERN SAFETY DEVICE FOR PREVENTING INTERFERENCE BETWEEN PATTERNS

TECHNICAL FIELD

The present invention relates, in general, to pattern safety devices for preventing interference between patterns and, more particularly, to a pattern safety device in which a separately partitioned space is defined in an adhesion portion, which is formed on a plurality of patterns on one surface of a substrate so that a circuit element is placed on the adhesion portion, thus preventing interference between the patterns.

BACKGROUND ART

Generally, electronic display boards using neon, cold cathode lamps (CCL), or light-emitting diodes (LED) are widely used as outdoor light-emitting devices. Also, an external electrode fluorescent lamp (EEFL), a cold cathode fluorescent lamp (CCFL), a light-emitting diode electronic display board, or the like is used as an indoor light-emitting device.

A neon or cold cathode lamp is disadvantageous because it consumes excessive power due to the use of high-voltage power, entails the risks of electric shocks and fire, and has a short lifespan. Also, an EEEL or a CCFL is disadvantageous because outdoor use is difficult due to the use of high frequency, and because it has low illuminance and a short lifespan.

Furthermore, an electronic display board using LEDs is characterized in that it emits light only in one direction because the back of the light-emitting surface is blocked by a cover plate due to the presence of electric wires or a black membrane.

Meanwhile, contemporary light-emitting devices are being used as advertising boards rather than merely just for lighting, and are widely used for aesthetic purposes in the field of interior design.

Such light-emitting devices include transparent electrodes or colored electrodes, which are provided on one surface of a substrate, and a circuit which has patterns formed by etching. Circuit elements are mounted so as to be electrically connected to the patterns. Therefore, such light-emitting devices are advantageous because the volume thereof can be reduced and the appearance thereof is improved.

As an example of the conventional technique, a transparent display board, which is a kind of light-emitting device having patterns formed on one surface of a substrate so that circuit elements are mounted to the patterns, was proposed in Korean Patent Unexamined Publication No. 2008-0101250 (date: Nov. 21, 2008). In this conventional transparent display board, a four-electrode light-emitting element is adhered to a transparent electrode by a conductive adhesive applied to the transparent electrode.

A plurality of wires is formed by etching the transparent electrode. The wires are required to be insulated from each other. However, when the light-emitting element is mounted to the display board, conductive adhesive applied to the transparent electrode may be spread around depending on the amount thereof and on the time for and position at which it is applied. If conductive adhesive applied to different electrode portions comes into contact with adhesive applied to other patterns, short circuits may occur due to interference between the patterns, or the appearance of the product is deteriorated because the conductive adhesive is seen with the naked eye.

Although the problem of interference between the patterns of the transparent display board has been illustrated as one example, this interference problem causing a short circuit or deterioration in appearance is associated with all kinds of devices which include patterns, through which electrical signals are input or output, and a circuit element adhered to the patterns by conductive adhesive. Therefore, a method for solving the above-mentioned problem is urgently required.

DISCLOSURE

TECHNICAL PROBLEM

Accordingly, the present invention has been made keeping in mind the above problems occurring in the prior art, and an object of the present invention is to provide a pattern safety device in which a separately partitioned space is defined in an adhesion portion, which is formed on a plurality of patterns formed on the surface of a substrate so that a circuit element is placed on the adhesion portion, thus preventing interference between the patterns.

TECHNICAL SOLUTION

In a pattern safety device for preventing interference between patterns according to the present invention, a circuit element is adhered to a plurality of patterns formed on a conductive electrode which is formed by applying conductive material to one surface of a substrate so that the circuit element can receive electrical signals from the respective patterns. A block pattern which has one or more insulated portions is formed on an adhesion portion, which is formed over one or more patterns, and to which the circuit element is adhered. The block pattern prevents the adhesive applied to each pattern from flowing into other electrodes or patterns.

ADVANTAGEOUS EFFECTS

According to the present invention, a block pattern is formed between patterns on which a circuit element is placed so that the patterns can be insulated and separated from each other. Thus, the present invention can prevent short circuits from occurring due to the spread of conductive adhesive. Furthermore, the present invention can prevent adhesive from spreading out of an adhesion portion. Therefore, for all kinds of devices in which circuit elements are adhered to patterns, the present invention can prevent failures due to short circuits and deterioration in appearance. Moreover, the structure of the pattern safety device is simple, and the work for embodying it is also simple. Thus, the present invention can be widely applied to all kinds of devices in which electricity is applied to circuit elements through patterns. Consequently, economic effects can also be expected.

BEST MODE

Figure 1:
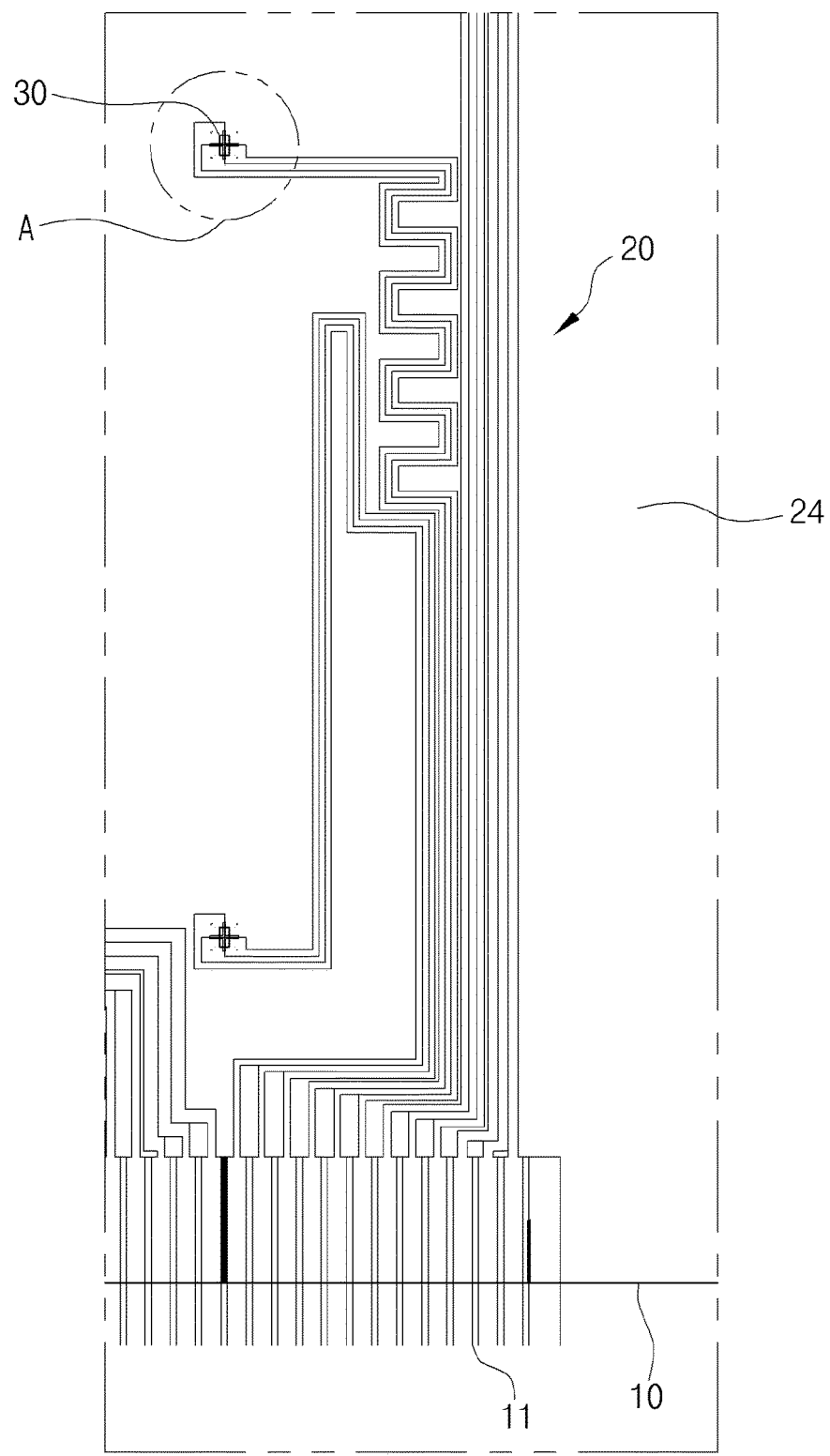
FIG. 1 is a view illustrating a transparent display board having a pattern safety device for preventing interference between patterns according to the present invention.

In order to accomplish the above object, in an embodiment, the present invention provides a pattern safety device for preventing interference between patterns, including: a plurality of patterns formed by dividing and partitioning an electrode into a plurality of portions, the electrode being formed by applying a conductive material to one surface of a substrate such that power is applied via the electrode, the plurality of patterns being configured to transmit different electrical signals; a circuit element comprising one or more terminals, through which electrical signals are input and output, the circuit element adhering to an adhesion portion formed over the plurality of patterns such that the terminals receive electrical signals from the respective patterns; and a block pattern comprising one or more portions formed by etching between the patterns in the adhesion portion so that the patterns are insulated from each other.

In another embodiment, the block pattern may include a block pattern portion defined both by at least one upper horizontal line, which is disposed above an etching line at a predetermined position spaced apart from the etching line and extends horizontally, and by at least one lower horizontal line, which is disposed below the etching line at a predetermined position spaced apart from the etching line and extends horizontally.

In a further embodiment, the block pattern may be defined both by at least one first-side vertical line, which is disposed on a first side of an etching line at a predetermined position spaced apart from the etching line and extends vertically, and by at least one second-side vertical line, which is disposed on a second side of the etching line at a predetermined position spaced apart from the etching line and extends vertically.

In yet another embodiment, the block pattern may be defined by one or more vertical side lines vertically extending on both ends of the upper and lower horizontal lines.

In still another embodiment, the block pattern may be defined by one or more horizontal side lines formed by etching in a horizontal direction between the first-side vertical line and the second-side vertical line.

Mode for Invention

Hereinafter, exemplary embodiments of a pattern safety device for preventing interference between patterns according to the present invention will be described in detail with reference to the attached drawings.

As described in the object and effects of the present invention, the present invention can be applied to all kinds of devices that include a pattern provided to transmit an electrical signal and a circuit device or light-emitting element which is operated by an electrical signal transmitted via the pattern.

To describe the technical spirit of the present invention, a plurality of patterns, which are formed by partitioning a transparent electrode of a transparent display board into a plurality of portions, and a light-emitting element, which are adhered to the surfaces of the patterns, will be described as one example. However, the technical spirit of the present invention is not limited to the transparent display board.

Figure 2:
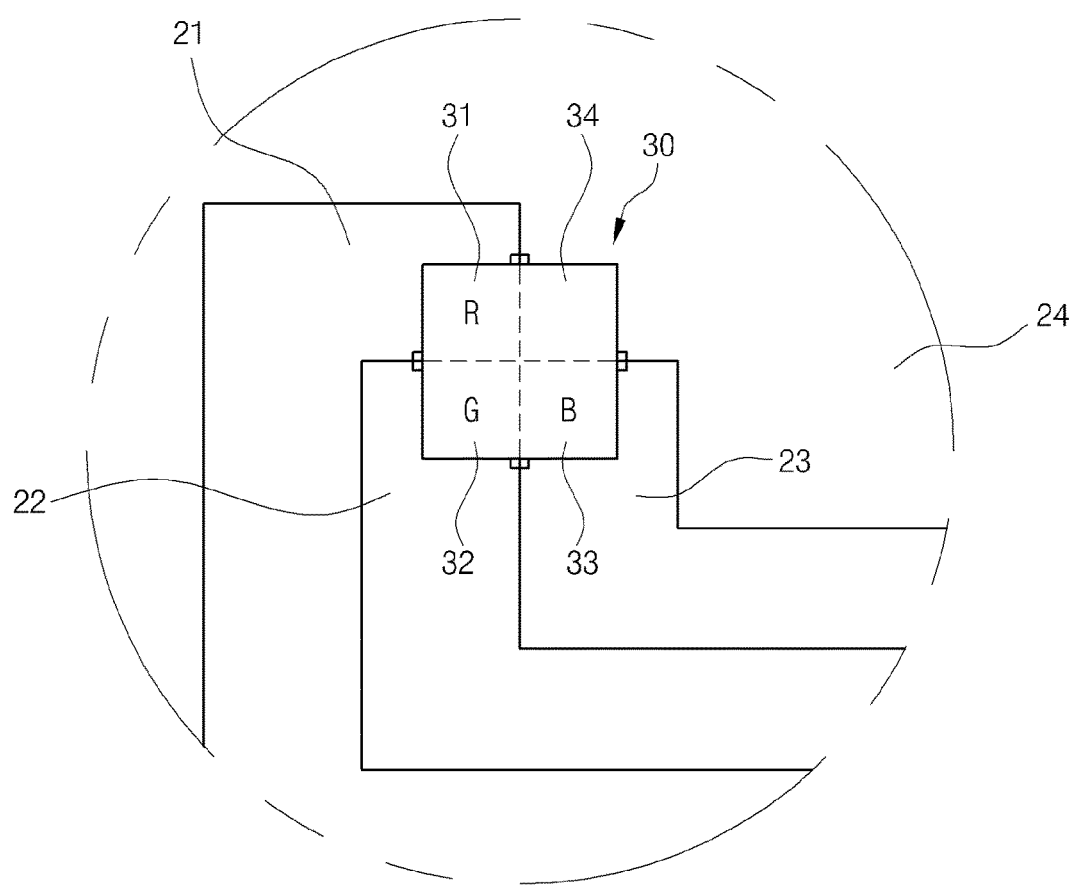
FIG. 2 is a view illustrating an enlargement of a light-emitting element provided on the transparent display board having the pattern safety device according to the present invention.

FIG. 1 is a view illustrating a transparent display board having a pattern safety device for preventing interference between patterns according to the present invention. FIG. 2 is a view illustrating an enlargement of a light-emitting element provided on the transparent display board having the pattern safety device according to the present invention.

Referring to FIGS. 1 and 2, the present embodiment includes: a transparent substrate 10; a transparent electrode 20 which is formed on the surface of the transparent substrate 10 by applying conductive material thereto so that power can be transmitted through the transparent electrode 20; a plurality of light-emitting elements 30 which emit light by means of power transmitted from the transparent electrode 20; and a block pattern (40, refer to FIG. 3) which prevents the adhesive, applied to adhere the light-emitting elements to the patterns, from flowing between the patterns.

The transparent substrate 10 is a substrate, for example, a glass plate, made of transparent material. A connector 11 from which power is supplied to the transparent electrode 20 is provided at one end of the transparent substrate 10. The connector 11, which is formed of transparent conductive tape, conducts a control signal from a controller disposed outside the transparent substrate 10 and applies power to the light-emitting element 30 adhered to the transparent electrode 20. The controller (not shown) has a well-known configuration, and thus a detailed description thereof or illustration in the drawings will be omitted.

The transparent electrode 20 is formed by applying conductive material to the surface of the transparent substrate 10 so that power is applied from the connector 11 via the transparent electrode 20. Here, the transparent electrode 20 is formed on the entirety of one surface of the transparent substrate 10 and is separated and partitioned by etching into patterns 21 through 24, which are connected to respective terminals of the light-emitting elements 30. The patterns 21 through 24 are separated from each other through the etching process, and are thus insulated from each other.

The patterns 21 through 24 are embodied in such a way that the number thereof corresponds to the number of terminals of the corresponding light-emitting element 30. For example, if each light-emitting element 30 is a four-electrode element, including first through third anode terminals 31 through 33 which emit light in R, G, and B colors, and a cathode terminal 34, four patterns are respectively connected to the first through third anode terminals 31 through 33 and the cathode terminal 34 of the light-emitting element 30.

The patterns 21 through 24 will be described in more detail with reference to FIG. 2 which is an enlarged view showing portion A of FIG. 1. The patterns 21 through 24 includes a first pattern 21 connected to the first anode terminal 31, a second pattern 22 connected to the second anode terminal 32, a third pattern 23 connected to the third anode terminal 33, and a fourth pattern 24 connected to the cathode terminal 34.

Figure 3:
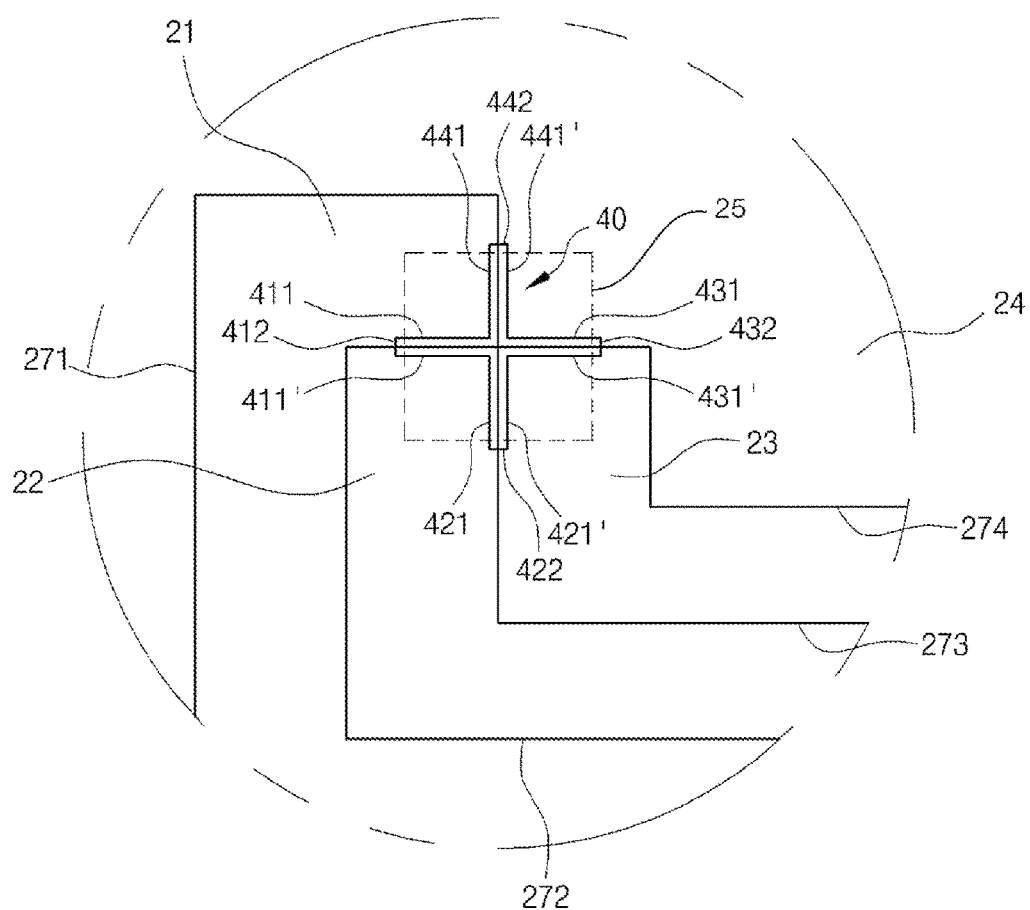
FIG. 3 is a view illustrating a block pattern of the pattern safety device according to the present invention.

Here, the first through fourth patterns 21 through 24 are spaced apart and insulated from each other by etching lines 271 through 274 (refer to FIG. 3). The fourth pattern 24 is a pattern which is connected to the cathode terminal 34 and corresponds to a remaining portion of the substrate that is not the first through third patterns 21 through 23 and is defined by etching the outer periphery of the first and third patterns 21 and 23. Thus, the fourth pattern 24 is connected to all of the cathode terminals 34 of the light-emitting elements 30.

The etching lines 271 through 274 include a first etching line 21 which separates and insulates the first pattern 271 from the fourth pattern 24, a second etching line 272 which separates and insulates the first pattern 21 from the second pattern 22, a third etching line 273 which separates and insulates the second pattern 22 from the third pattern 23, and a fourth etching line 274 which separates and insulates the third pattern 23 from the fourth pattern 24.

The block pattern 40 will be described with reference to FIG. 3. FIG. 3 is a view illustrating the block pattern which is formed on the transparent display board to block adhesive from flowing.

Referring to FIG. 3, the block pattern 40 comprises one or more block patterns 40 which are longitudinally and laterally formed by etching to form spaces in an adhesion portion 25, to which the light-emitting element 30 is adhered. The etching lines 271 through 274 are disposed in the respective spaces formed by the block patterns 40. An adhesive is applied in the adhesion portion 25 formed on the ends of the first through fourth patterns 21 through 24. The block patterns 40 prevent the adhesive from flowing between the patterns.

That is, the block pattern 40, for example, has a cross shape and comprises one or more patterns which are formed by etching one or more corresponding block pattern portions of the substrate while the first through fourth etching lines 271 through 274, which separate the first through fourth patterns 21 through 24 from each other, are disposed in the block pattern portions.

The block pattern 40 includes: a first block pattern portion 41 which includes one or more insulated pattern portions formed by means of etching opposite sides of the second etching line 272 that separates the first pattern 21 from the second pattern 22; a second block pattern portion 42 which includes one or more insulated pattern portions formed by means of etching opposite sides of the third etching line 273 that separates the second pattern 22 from the third pattern 23; a third block pattern portion 43 which includes one or more insulated pattern portions formed by means of etching opposite sides of the fourth etching line 274 that separates the third pattern 23 from the fourth pattern 24; and a fourth block pattern portion 44 which includes one or more insulated pattern portions formed by means of etching opposite sides of the first etching line 271 that separates the first pattern 21 from the fourth pattern 24.

The first block pattern portion 41 is formed of portions which are defined both by a first upper horizontal line 411 and a first lower horizontal line 411', which horizontally extend on upper and lower sides of the second etching line 272, and by first vertical side lines 412, which vertically extend on both ends of the first upper horizontal line 411 and the first lower horizontal line 411'.

Here, the first upper horizontal line 411 and the first lower horizontal line 411' are formed by etching on the upper and lower sides of the second etching line 272 at positions spaced apart from each other so that an insulated portion is formed between the first upper horizontal line 411, the first lower horizontal line 411', and the first vertical side lines 412. Although each line is illustrated as being a single line formed by etching, it may be formed of two or more lines.

The second block pattern portion 42 is formed of portions which are defined both by a second first-side vertical line 421 and a second second-side vertical line 421', which are formed by etching and vertically extend on left and right sides of the third etching line 273, and by second horizontal lines 422, which horizontally extend on both ends of the second first-side vertical line 421 and the second second-side vertical line 421'.

Although each of the second first-side vertical line 421, the second second-side vertical line 421', and the second horizontal lines 422 has been illustrated as being formed through a single etching process, the etching process may be conducted several times.

The third block pattern portions 43 are formed of portions which are defined both by a third upper horizontal line 431 and a third lower horizontal line 431', which horizontally extend on upper and lower sides of the fourth etching line 274, and by third vertical side lines 432, which vertically extend on both ends of the third upper horizontal line 431 and the third lower horizontal line 431'.

Here, the third upper horizontal line 431 and the third lower horizontal line 431' are formed by etching on the upper and lower sides of the fourth etching line 274 at positions spaced apart from each other. Although each of the third upper horizontal line 431, the third lower horizontal line 431', and the third vertical side lines 432 is illustrated as being a single line formed by etching, it may be formed of two or more lines.

The fourth block pattern portion 44 is formed of portions which are defined both by a fourth first-side vertical line 441 and a fourth second-side vertical line 441', which are formed by etching and vertically extend on left and right sides of the first etching line 271, and by fourth horizontal lines 442, which horizontally extend on both ends of the fourth first-side vertical line 441 and the fourth second-side vertical line 441'.

As stated above, although each of the fourth first-side vertical line 441, the fourth second-side vertical line 441', and the fourth horizontal lines 442 has been illustrated as being formed through a single etching process, the etching process may be conducted several times.

In the present invention, the block pattern is configured such that the first through fourth insulated block pattern portions 41 through 44 are formed between the first through fourth patterns 21 through 24, whereby adhesive applied to the adhesion portion of the light-emitting element 30 can be prevented from undesirably flowing out of the adhesion portion, thereby preventing short circuits from occurring due to the flow of electricity between the patterns.

Figure 4:
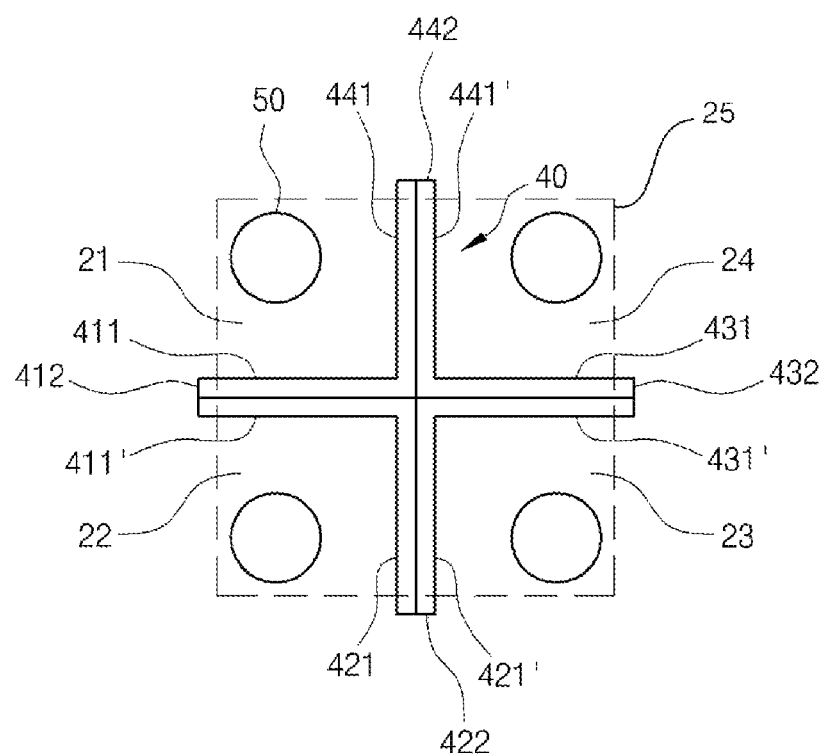
FIG. 4 is a view illustrating a first embodiment of the block pattern of the pattern safety device according to the present invention.

FIG. 4 is a view illustrating a first embodiment of the block pattern of the pattern safety device according to the present invention. In the first embodiment, a four-electrode light-emitting element will be described for illustrative purposes.

Referring to FIG. 4, adhesive 50 is applied to each of the first through fourth patterns 21 through 24. Conductive adhesive is used as the adhesive 50. When the light-emitting element 30 is placed on the patterns 21 through 24, the adhesive 50 conductively bonds the first anode terminal 31 to the first pattern 21, the second anode terminal 32 to the second pattern 22, the third anode terminal 33 to the third pattern 23, and the cathode terminal 34 to the fourth pattern 24.

Therefore, when the light-emitting element 30 is placed on the adhesion portion 25, the adhesive applied to each pattern is pressed by the light-emitting element 30 and thus spreads around. Here, if the amount of adhesive 50 is comparatively large relative to the area of each of the patterns 21 through 24 formed in the adhesion portion 25, the adhesive 50 that is pressed by the light-emitting element 30 and spreads around may flow over the etching lines 271 through 274 into the adjacent patterns.

However, in the present invention, the one or more block pattern portions 41 through 44, which horizontally and vertically separate the patterns 21 through 24 from each other with the etching lines 271 through 274 disposed in the respective block pattern portions 41 through 44, can block the flow of the adhesive and thus prevent the adhesive applied to each pattern from flowing into the other adjacent patterns.

For the case where the light-emitting element 30 is displaced to the left or right from the correct position rather than being aligned with the correct position of the adhesion portion 25, the present invention will be compared with the conventional technique. For instance, in the conventional technique, if the second anode terminal 32 is displaced to the right from the correct position when the light-emitting element 30 is seated on the adhesion portion, the second anode terminal 32 is disposed above both the first pattern 21 and the second pattern 22, thus causing a short circuit.

However, in the present invention, the first block pattern portion 41 is formed between the first pattern 21 and the second pattern 22. Therefore, even if the second anode terminal 32 is misaligned from the correct position of the second pattern 22, the portion of the second anode terminal 32 that is displaced from the second pattern 22 is positioned in the first block pattern position 41. Thereby, a short circuit can be prevented.

Figure 5:
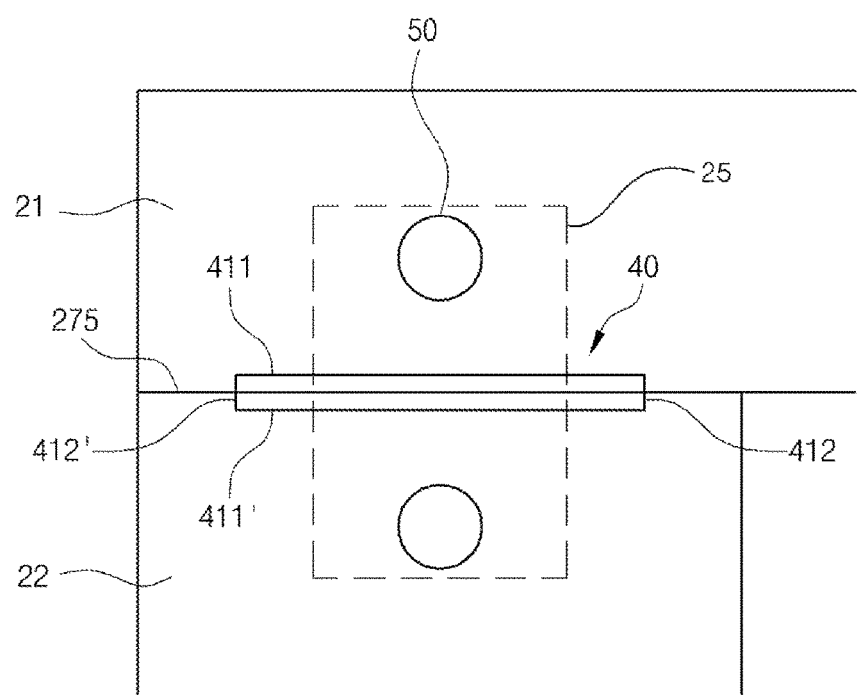
FIG. 5 is a view illustrating a second embodiment of the block pattern of the pattern safety device according to the present invention.

FIG. 5 is a view illustrating a second embodiment of the block pattern of the pattern safety device according to the present invention. In the second embodiment, a two-electrode light-emitting element will be described for illustrative purposes.

Referring to FIG. 5, the patterns 21 and 22 include a first pattern 21 which applies an electrical signal to an anode terminal of a two-electrode light-emitting element 30, and a second pattern 22 which applies an electrical signal to a cathode terminal of the two-electrode light-emitting element 30.

The adhesion portion 25 is set to a portion which is formed on the ends of the first and second patterns 21 and 22 and has a size corresponding to the size of the two-electrode light-emitting element 30.

The block pattern 40 is formed of a portion which is defined by one or more etching lines 411, 411', 412, and 412' provided on upper and lower sides of an etching line 275, which separates the first pattern 21 from the second pattern 22.

Furthermore, the adhesive 50 is applied to each of the first and second patterns 21 and 22 in the adhesion portion 25.

Therefore, when the light-emitting element 30 is placed on the adhesion portion 25, the adhesive 50 that is applied to the first pattern 21 and the second pattern 22 is pressed by the light-emitting element 30 and spreads around while the light-emitting element 30 is adhered to the adhesion portion 25 by means of the adhesive 50. Conductive adhesive is used as the adhesive 50 so that electrical signals can be applied to the anode terminal and the cathode terminal of the light-emitting element 30.

The block pattern 40 prevents the adhesive 50 applied to each pattern from flowing into the other adjacent patterns when the light-emitting element 30 is placed on the adhesion portion 25.

Figure 6:
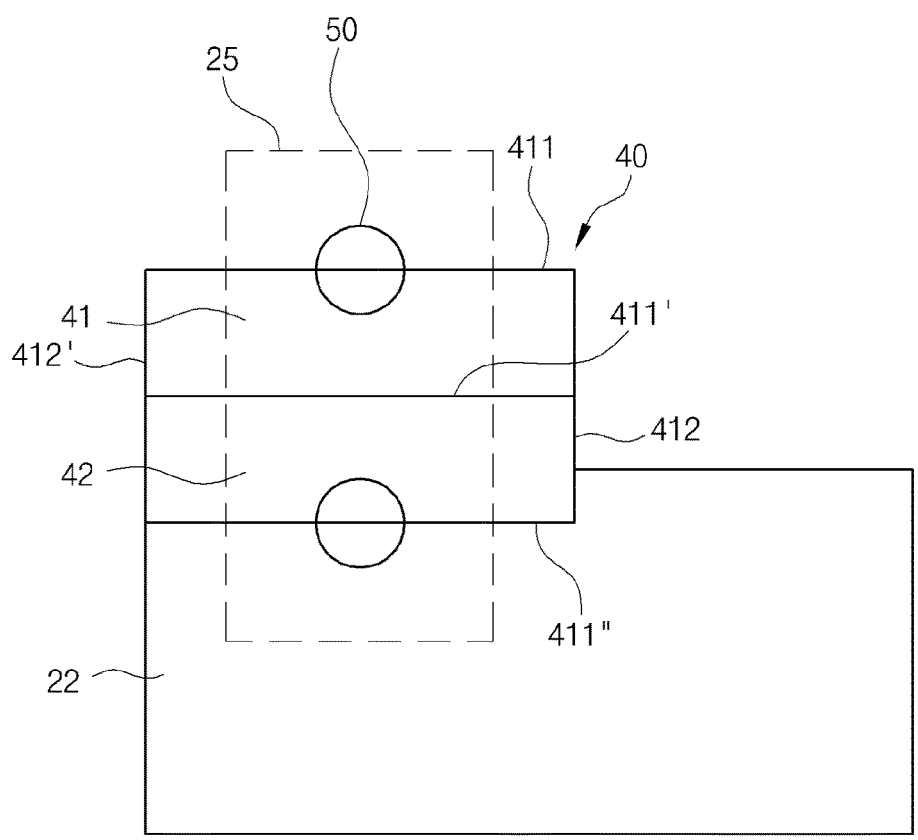
FIG. 6 is a view illustrating a third embodiment of the block pattern of the pattern safety device according to the present invention.

FIG. 6 is a view illustrating a third embodiment of the block pattern of the pattern safety device according to the present invention.

The third embodiment of the block pattern of the pattern safety device according to the present invention will be explained using another example of the two-electrode light-emitting element with reference to FIG. 6.

Referring to FIG. 6, the patterns 21 and 22 include a first pattern 21 which applies an electrical signal to an anode terminal of a two-electrode light-emitting element 30, and a second pattern 22 which applies an electrical signal to a cathode terminal of the two-electrode light-emitting element 30.

The adhesion portion 25 is set to a portion which is formed on the ends of the first and second patterns 21 and 22 and has a size corresponding to the size of the two-electrode light-emitting element 30.

The block pattern 40 includes a first block pattern portion 41 and a second block pattern portion 42 which are defined by one or more etching lines 411, 411', 411", 412, and 412', which are disposed spaced apart from each other at upper and lower positions on both the first pattern 21 and the second pattern 22.

The first block pattern portion 41 is defined both by the first upper horizontal line 411 and the first lower horizontal line 411', which are formed at upper and lower positions spaced apart from each other, and by the first first-side vertical line 421 and the first second-side vertical line 421', which vertically extend from both ends of the first upper horizontal line 411 and the first lower horizontal line 411'.

The second block pattern portion 42 is formed of a portion which is defined by the first lower horizontal line 411', the first lowermost horizontal line 411", which horizontally extends at a position spaced apart from the first lower horizontal line 411', and the first first-side vertical line 412 and the first second-side vertical line 412', which vertically extend from both ends of the first lower horizontal line 411' and the first lowermost horizontal line 411".

Furthermore, the adhesive 50 is applied to each of the first and second patterns 21 and 22 in the adhesion portion 25. In detail, the adhesive 50 is applied both to the first pattern 21 and to the first block pattern portion 41 at the junction between the first pattern 21 and the first block pattern portion 41. Furthermore, the adhesive 50 is applied both to the second pattern 22 and to the second block pattern portion 42 at the junction between the second pattern 22 and the second block pattern portion 42.

Therefore, when the light-emitting element 30 is placed on the adhesion portion 25, the adhesive 50 that is applied to the first pattern 21 and the second pattern 22 is pressed by the light-emitting element 30 and spreads around while the light-emitting element 30 is adhered to the adhesion portion 25 by means of the adhesive 50. Conductive adhesive is used as the adhesive 50 so that electrical signals can be applied to the anode terminal and the cathode terminal of the light-emitting element 30.

The block pattern 40 prevents the adhesive 50 applied to each pattern from flowing into the other adjacent patterns when the light-emitting element 30 is placed on the adhesion portion 25.

As described above, the present invention includes the block pattern 40 having one or more additional block pattern portions 41 through 44 which are formed by etching on the opposite sides of the etching lines that separate and insulate the patterns from each other. Thus, even if a large amount of adhesive, compared to the area of each pattern, is applied to the pattern, the adhesive can be prevented from flowing into the other adjacent patterns.

That is, when the light-emitting element is placed on the adhesion portion, even if the conductive adhesive applied to each pattern is pressed by the light-emitting element and thus spreads around, the block pattern prevents the adhesive applied to each pattern from flowing into the other adjacent patterns. Consequently, the present invention can prevent short circuits that would otherwise be caused when the conductive adhesive applied to each pattern flows into adjacent patterns, whereby the conductive adhesive electrically connects the patterns, which must be insulated from each other, to each other.

Furthermore, the present invention can eliminate the problem of failure in the shape attributable to adhesive flowing into the adjacent pattern portions or out of the adhesion portion.

In addition, in the present invention, the block pattern forms a separate insulated space between the adjacent patterns in the adhesion portion. Therefore, even when the light-emitting element is displaced from the correct position in the adhesion portion, a single terminal of the light-emitting element can be prevented from being connected to two patterns together, thus preventing a short circuit between the two patterns.

That is, in the present invention, an insulated space is formed between the adjacent patterns. Hence, even if the light-emitting element is misaligned from the correct position when it is placed on the adhesion portion, a terminal of the light-emitting element is placed on only one pattern and the block pattern portion rather than being placed on two adjacent patterns. Thus, interference between the two adjacent patterns can be prevented.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

The present invention can improve the appearance of a product and prevent failure resulting from interference between two patterns and thus can be effectively applied to transparent display boards which are used for the purpose of advertising or decoration.

The invention claimed is:

1. A pattern safety device for preventing interference between patterns, comprising:
a plurality of patterns defined by a plurality of portions of an electrode, which is formed by dividing and partitioning the electrode, the electrode being formed by applying a conductive material to one surface of a substrate such that power is applied via the electrode, the plurality of patterns being spaced apart and insulated from each other via an etching line therebetween to transmit different electrical signals;
a circuit element comprising one or more terminals, through which electrical signals are input and output, the circuit element being adhered to an adhesion portion of the plurality of patterns such that the terminals is electrically connected to the respective patterns; and
a block pattern comprising one or more portions of the electrode formed, by etching, between adhesion portion of adjacent patterns, wherein the block pattern is insulated from the adjacent patterns,
wherein the one or more portions comprise a portion defined both by an upper horizontal etching line, which is disposed above a portion of the etching line adjacent thereto at a predetermined position spaced apart from the etching line and extends parallel to the portion of the etching line, and by a lower horizontal etching line, which is disposed below the etching line adjacent thereto at a predetermined position spaced apart from the etching line and extends parallel to the portion of the etching line, and
wherein the upper horizontal etching line, the portion of the etching line and the lower horizontal etching line, which are parallel to each other, are disposed between the adhesion portions of the adjacent patterns.

2. The pattern safety device of claim 1, wherein the block pattern is defined both by at least one first-side vertical etching line, which is disposed on a first side of the etching line at a predetermined position spaced apart from the etching line and extends vertically, and by at least one second-side vertical etching line, which is disposed on a second side of the etching line at a predetermined position spaced apart from the etching line and extends vertically.

3. The pattern safety device of claim 2, wherein the block pattern is defined by one or more horizontal side etching lines formed by etching in a horizontal direction between the first-side vertical etching line and the second-side vertical etching line.

4. The pattern safety device of claim 1, wherein the block pattern is defined by one or more vertical side etching lines vertically extending on both ends of the upper and lower horizontal etching lines.

* * * * *